United States Patent
Hudgens et al.

(10) Patent No.: US 6,511,862 B2
(45) Date of Patent: Jan. 28, 2003

(54) MODIFIED CONTACT FOR PROGRAMMABLE DEVICES

(75) Inventors: Stephen J. Hudgens, Santa Clara, CA (US); Tyler A. Lowrey, San Jose, CA (US)

(73) Assignee: Ovonyx, Inc., Boise, ID (US)

( * ) Notice: Subject to any disclaimer, the term of this patent is extended or adjusted under 35 U.S.C. 154(b) by 0 days.

(21) Appl. No.: 09/896,009

(22) Filed: Jun. 30, 2001

(65) Prior Publication Data

US 2003/0001211 A1 Jan. 2, 2003

(51) Int. Cl.[7] .............................................. H01L 21/06
(52) U.S. Cl. ............................ 438/95; 438/98; 438/102
(58) Field of Search ........................... 438/95, 98, 102; 257/2–5

(56) References Cited

U.S. PATENT DOCUMENTS

| | | |
|---|---|---|
| 5,296,716 A | 3/1994 | Ovshinsky et al. |
| 5,789,758 A | 8/1998 | Reinberg |
| 5,879,955 A | 3/1999 | Gonzalez et al. |
| 5,920,788 A | 7/1999 | Reinberg |
| 5,933,365 A | 8/1999 | Klersy et al. |
| 5,970,336 A | 10/1999 | Wolstenhome et al. |
| 5,998,244 A * | 12/1999 | Wolstenholme ............. 438/128 |
| 6,002,140 A | 12/1999 | Gonzalez et al. |
| 6,031,287 A | 2/2000 | Harshfield |
| 6,087,674 A | 7/2000 | Ovshinsky et al. |
| 6,153,890 A | 11/2000 | Wolstenholme et al. |
| 6,229,157 B1 | 5/2001 | Sandhu |
| 2002/0101481 A1 * | 8/2002 | McClelland ................. 347/56 |

OTHER PUBLICATIONS van Zant, Microchip Fabrication: A Practical Guide to Semiconductor Processing, 4th ed., McGrawHill, 2000, pp. 345,346, 354.*

* cited by examiner

Primary Examiner—Eddie Lee
Assistant Examiner—Marcos D. Pizarro-Crespo
(74) Attorney, Agent, or Firm—Trop, Pruner & Hu, P.C.

(57) ABSTRACT

In an aspect, an apparatus is provided that sets and reprograms the state of programmable devices. In an aspect, a method is provided such that an opening is formed through a dielectric exposing a contact formed on a substrate. The resistivity of the contact is modified by at least one of implanting ions into the contact, depositing a material on the contact, and treating the contact with plasma. In an aspect, a spacer is formed within the opening and programmable material is formed within the opening and on the modified contact. A conductor is formed on the programmable material and the contact transmits to a signal line.

6 Claims, 17 Drawing Sheets

MODIFIED CONTACT FOR PROGRAMMABLE DEVICES

FIELD

Programmable devices including phase change memory devices, having a compositionally modified contact, that can be programmed by changing the state of a phase change material.

BACKGROUND

Typical computers, or computer related devices, include physical memory, usually referred to as main memory or random access memory (RAM). Generally, RAM is memory that is available to computer programs and read-only memory (ROM) is memory that is used, for example, to store programs that boot a computer and perform diagnostics. Typical memory technologies include dynamic random access memory (DRAM), static random access memory (SRAM), erasable programmable read-only memory (EPROM), and electrically erasable programmable read-only memory (EEPROM).

Solid state memory devices typically employ microelectronic circuit elements for each memory bit (e.g., one to four transistors per bit) in memory applications. Since one or more electronic circuit elements are required for each memory bit, these devices may consume considerable chip "real estate" to store a bit of information, which limits the density of a memory chip. The primary "non-volatile" memory element of these devices, such as an EEPROM, typically employ a floating gate field effect transistor device that has limited re-programmability and which holds a charge on the gate of field effect transistor to store each memory bit. These classes of memory devices are also relatively slow to program.

Phase change memory devices use phase change materials, i.e., materials that can be electrically switched between a generally amorphous and a generally crystalline state, for electronic memory application. One type of memory element originally developed by Energy Conversion Devices, Inc. of Troy, Mich. utilizes a phase change material that can be, in one application, electrically switched between a structural state of generally amorphous and generally crystalline local order or between different detectable states of local order across the entire spectrum between completely amorphous and completely crystalline states. These different structured states have different values of resistivity, and therefore different electrical read-out. Typical materials suitable for such application include those utilizing various chalcogenide elements. These electrical memory devices typically do not use field effect transistor devices as the memory storage element, but comprise, in the electrical context, a monolithic body of thin film chalcogenide material. As a result, very little chip real estate is required to store a bit of information, thereby providing for inherently high density memory chips. The state change materials are also truly non-volatile in that, when set in either a crystalline, semi-crystalline, amorphous, or semi-amorphous state representing a resistance value, that value is retained until reprogrammed as that value represents a physical state of the material (e.g., crystalline or amorphous). Thus, phase change memory materials represent a significant improvement in non-volatile memory.

One characteristic common to solid state and phase change memory devices is significant power consumption particularly in setting or reprogramming memory elements. Power consumption is important, particularly in portable devices that rely on power cells (e.g., batteries). It would be desirable to decrease the power consumption of a memory device. Another characteristic common to solid state and phase change memory devices is limited reprogrammable cycle life from/to an amorphous and crystalline state. Further, over time the phase change material can fail to reliably reprogram from/to an amorphous and a crystalline state. It would be desirable to increase the programmable cycle life of the phase change memory material.

Chemical reactivity and delamination of phase change material is a concern common to solid state and phase change memory devices. It would be desirable to increase the adherence of phase change material to its contact and simultaneously decrease the chemical reactivity of phase change material with its contact.

BRIEF DESCRIPTION OF THE DRAWINGS

Additional advantages of the invention will become apparent upon reading the following detailed description and upon reference to the drawings, in which.

DETAILED DESCRIPTION

Exemplary embodiments are described with reference to specific configurations. Those of ordinary skill in the art will appreciate that various changes and modifications can be made while remaining within the scope of the appended claims. Additionally, well-known elements, devices, components, circuits, process steps and the like may not be set forth in detail in order to avoid obscuring the invention.

A memory device utilizing programmable material (e.g. phase change) to determine the state of memory elements of the device is described. The programmable material reprograms to an amorphous and crystalline state with improved (generally lower) power consumption relative to previous devices, achieved in part by modifying the resistivity of a contact. In an embodiment, the resistivity of the contact is increased, increasing power dissipation in the contact and increasing heat transferred from the contact to the programmable material, thereby reducing the required programming current and improving reprogramming reliability. In an embodiment, an improved (generally less) chemically reactive contact is described. In an embodiment, a programmable material having improved adherence (e.g. less delamination) to a contact is described.

In another embodiment, a method of modifying the resistivity of a contact is described. The contact can be modified by at least one of implanting ions into the contact, depositing material on the contact, and treating the contact with plasma. Implanting of ions can be performed at normal incidence to a surface of the contact exposed to the opening, and also at an angle to the surface of the contact exposed to the opening.

The described memory device and method provides lower programming current requirements, improved device reliability, improved programmable cycle life, and lower cost and scalability relative to previous devices. Further, in an embodiment, the apparatus is manufacturable with conventional process toolsets and facilities.

Figure 1:
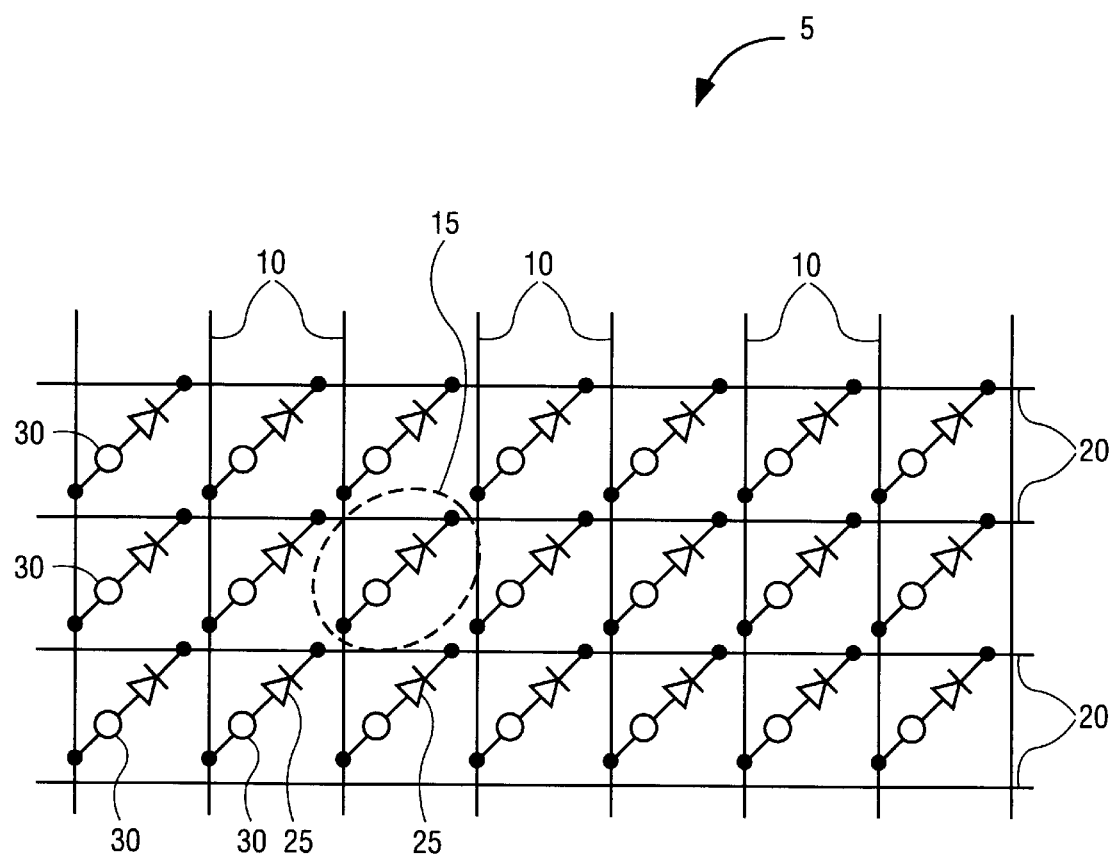
FIG. 1 is a schematic diagram of an embodiment of an array of memory elements.

FIG. 1 shows a schematic diagram of an embodiment of a memory array comprised of a plurality of memory elements presented and formed in the context of the description provided herein. In this example, the circuit of memory array 5 includes an xy grid with memory elements 30 electrically interconnected in series with isolation devices 25 on a portion of a chip. Address lines 10 (e.g., columns) and 20 (e.g., rows) are connected, in one embodiment, to external addressing circuitry in a conventional manner. One purpose of the xy grid array of memory elements in combination with isolation devices is to enable each discrete memory element to be read and written without interfering with the information stored in adjacent or remote memory elements of the array.

A memory array such as memory device 5 of FIG. 1 can be formed in a portion, including the entire portion, of a substrate. A typical substrate includes a semiconductor substrate such as a silicon substrate. Other substrates including, but not limited to, substrates that contain ceramic material, organic material, or glass material as part of the infrastructure are also suitable. In the case of a silicon semiconductor substrate, memory array 5 can be fabricated over an area of the substrate at the wafer level and then the wafer reduced through singulation into discrete die or chips, some or all of the die or chips having a memory array formed thereon. Additional addressing circuitry (e.g., decoders, etc.) can be formed as known to those of skill in the art.

Figure 2:
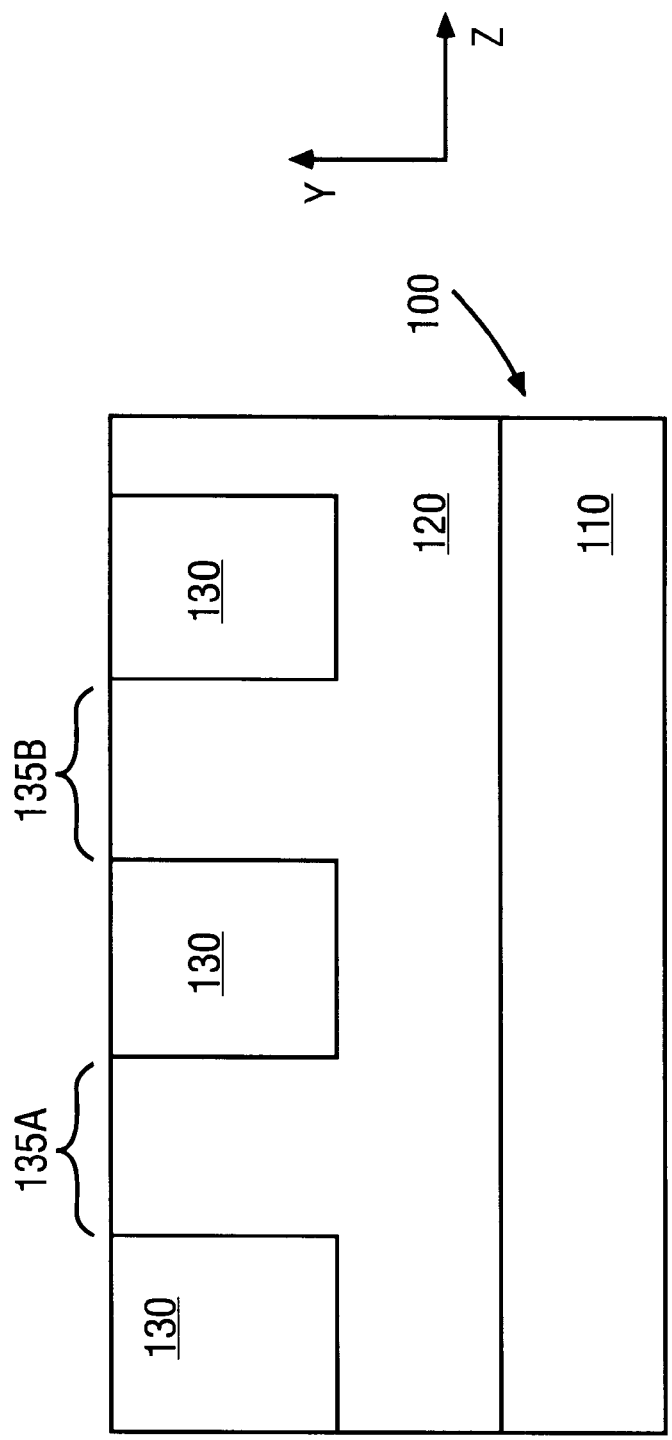
FIG. 2 schematically illustrates a cross-sectional planar side view of a portion of a semiconductor substrate having dielectric trenches formed therein defining a z-direction thickness of a memory cell in accordance with one embodiment of forming memory element on a substrate.

FIGS. 2–14 illustrate an embodiment of the fabrication of representative memory element 15 of FIG. 1. FIG. 2 depicts a portion of substrate 100 that is, for example, a semiconductor (e.g., silicon) substrate. In this example, a P-type dopant such as boron is introduced in portion 110. In one example, a suitable concentration of P-type dopant is on the order of about $5 \times 10^{19}$ to $1 \times 10^{20}$ atoms per cubic centimeters (atoms/cm$^3$) rendering portion 110 of substrate 100 representatively P$^{++}$. Overlying portion 1 10 of substrate 100, in this example, is portion 120 of P-type epitaxial silicon. In one example, the dopant concentration is on the order of about $10^{16}$ to $10^{17}$ atoms/cm$^3$.

FIG. 2 also depicts shallow trench isolation (STI) structures 130 formed in epitaxial portion 120 of substrate 100. As will become apparent in the subsequent discussion, STI structures 130 serve, in one aspect, to define the z-direction thickness of a memory cell, with at this point only the z-direction thickness of a memory cell defined. In one embodiment, memory cell z-direction regions 135A and 135B are patterned as strips with the x-direction dimension greater than the z-direction dimension. In another aspect, STI structures 130 serve to isolate individual memory elements from one another as well as associated circuit elements (e.g., transistor devices) formed in and on the substrate. Current state of the art photolithography techniques utilized to pattern STI structures define the z-direction thickness of memory cell regions 135A and 135B can produce feature sizes (z-direction thickness) as small as 0.25 microns ($\mu$m).

Figure 3:
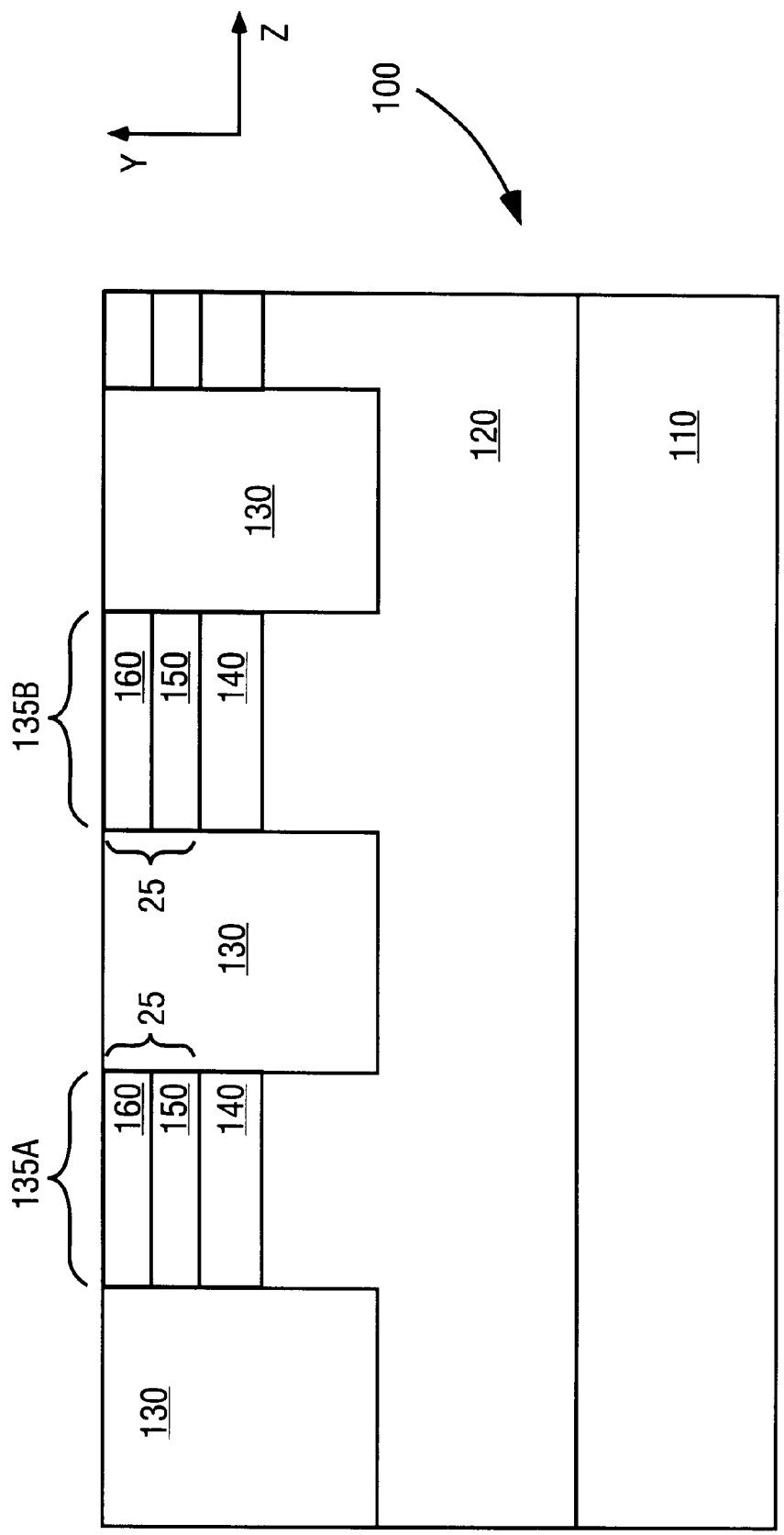
FIG. 3 depicts the structure of FIG. 2, through the same cross-sectional view, after the introduction of dopants to form an isolation device for a memory element.

FIG. 3 depicts the structure of FIG. 2 after further fabrication operations in memory cell regions 135A and 135B. Within each memory cell region (strip), overlying epitaxial portion 120 of substrate 100 is first conductor or signal line material 140. In one example, first conductor or signal line material 140 is N-type doped silicon formed by the introduction of, for example, phosphorous or arsenic to a concentration on the order of about $10^{18}$ to $10^{19}$ atoms/cm$^3$ (e.g., N$^+$ silicon). In this example, first conductor or signal line material 140 serves as an address line, a row line (e.g., row line 20 of FIG. 1). Overlying first conductor or signal line material 140 is an isolation device (e.g., isolation device 25 of FIG. 1). In one example, the isolation device is a PN diode formed of N-type silicon portion 150 (e.g., dopant concentration on the order of about $10^{14}$ to $10^{18}$ atoms/cm$^3$) and P-type silicon portion 160 (e.g., dopant concentration on the order of about $10^{19}$ to $10^{20}$ atoms/cm$^3$). Although a PN diode is shown, it is to be appreciated that other isolation structures are similarly suitable. Such devices include, but are not limited to, metal oxide semiconductor (MOS) devices.

Figure 4:
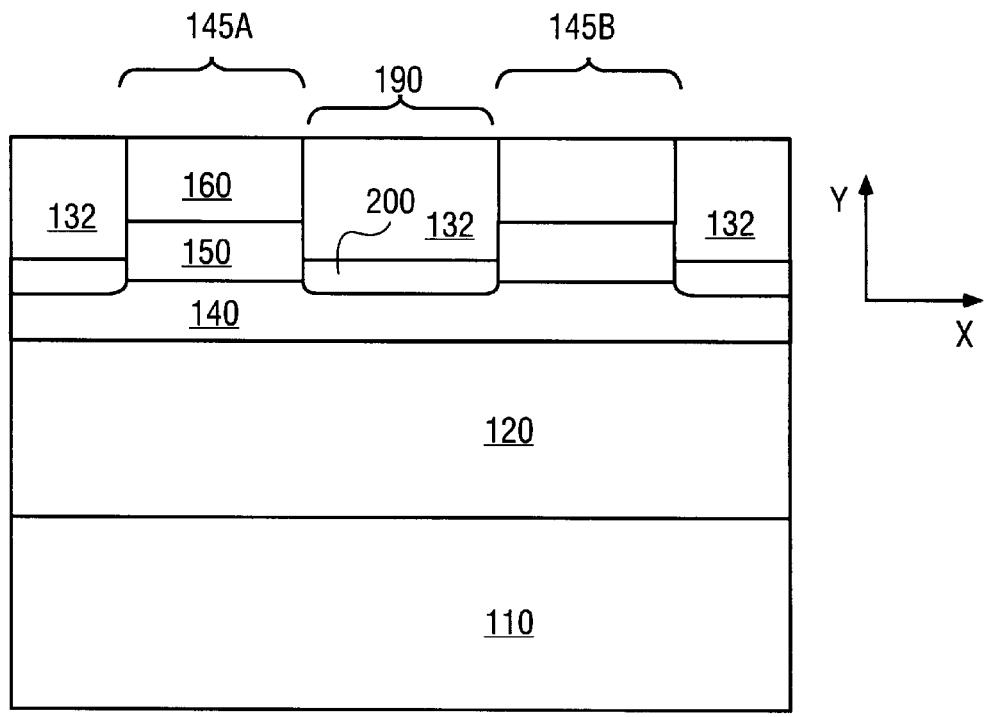
FIG. 4 depicts the structure of FIG. 3 after forming trenches.

FIG. 4 depicts the structure of FIG. 3 from an xy perspective after forming trenches 190 in epitaxial portion 120 of substrate 100. Trenches 190 are formed, in this example, orthogonal to STI structures 130. Trenches 190 define the x-direction thickness of a memory cell. According to current photolithographic techniques, a suitable feature size for the x-direction thickness is as small as 0.25 μm. FIG. 4 also depicts memory cells 145A and 145B separated by trenches 190, having a z-direction thickness defined by STI structures 130 and an x-direction thickness defined by trenches 190. The definition of the x-direction thickness involves, in one embodiment, an etch to the conductor or signal line 140 of the memory line stack to define memory cells 145A and 145B of memory cell region 135A. In the case of an etch, the etch proceeds through the memory line stack to, in this example, a portion of conductor or signal line 140. A timed etch can be utilized to stop an etch at this point. Following the patterning, N-type dopant is introduced at the base of each trench 190 to form pockets 200 having a dopant concentration on the order of about $10^{18}$ to $10^{20}$ atoms/cm$^3$ (e.g., N$^+$ region) between memory cells 145A and 145B.

Figure 5:
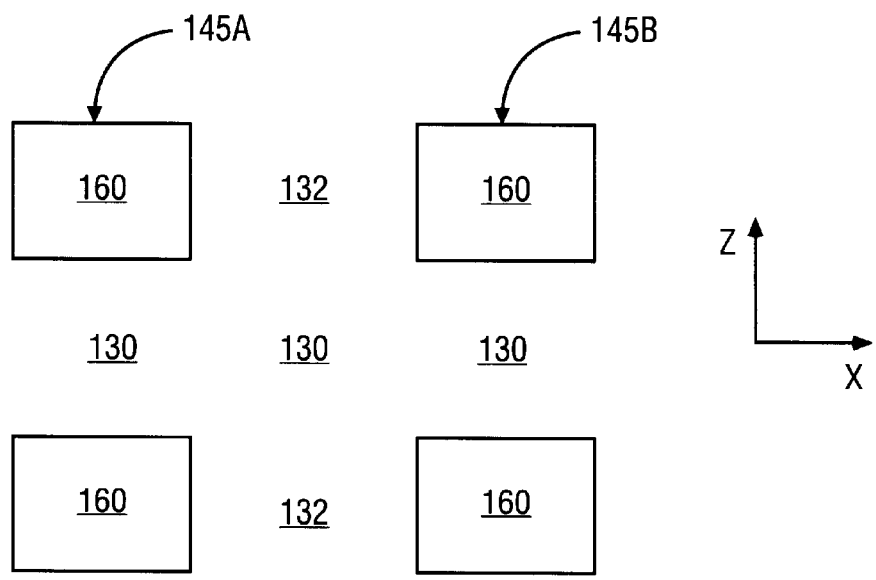
FIG. 5 depicts a schematic top view of the structure of FIG. 4.

Following the introduction of pockets 200, a dielectric material such as silicon dioxide is introduced in trenches 190 to form STI structures 132. The superior surface (as viewed) may then be planarized with, for example, a chemical-mechanical polish. FIG. 5 depicts an xz perspective of the structure of FIG. 4 with memory cells (e.g., memory cells 145A and 145B) separated by STI structures 130 and 132.

Figure 6:
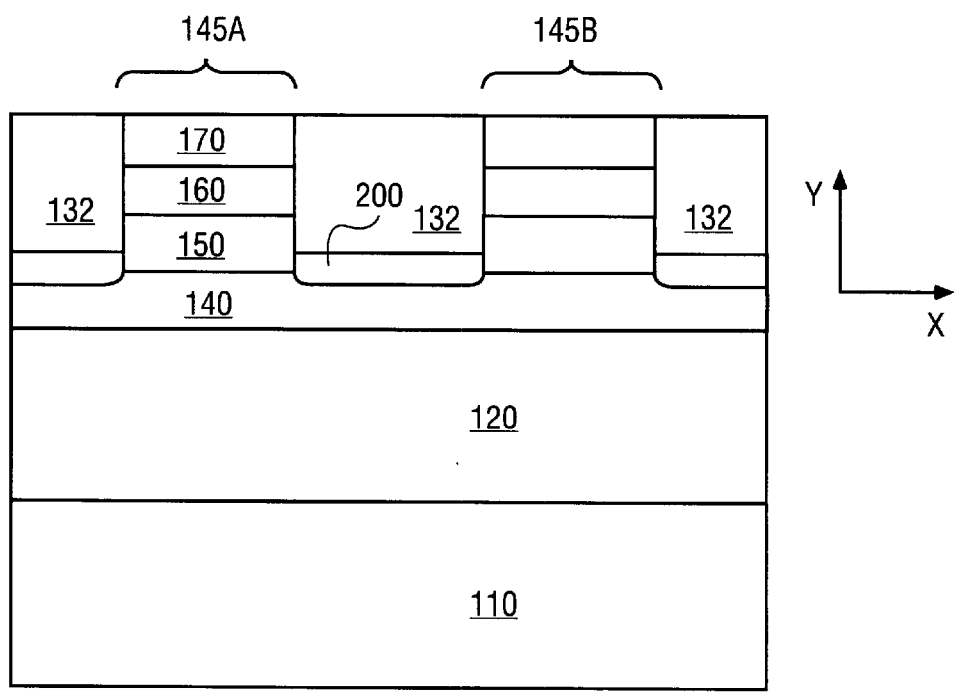
FIG. 6 depicts the structure of FIG. 4 after forming contacts.

FIG. 6 depicts the structure of FIG. 4 (i.e., an xy perspective) following the formation of a material of, in this example, refractory metal silicide such as cobalt silicide (CoSi$_2$) in a portion of p-type silicon portion 160 to define contact 170. Contact 170, in one aspect, serves as a low resistance material in the fabrication of peripheral circuitry (e.g., addressing circuitry) of the circuit structure on the chip.

Figure 7:
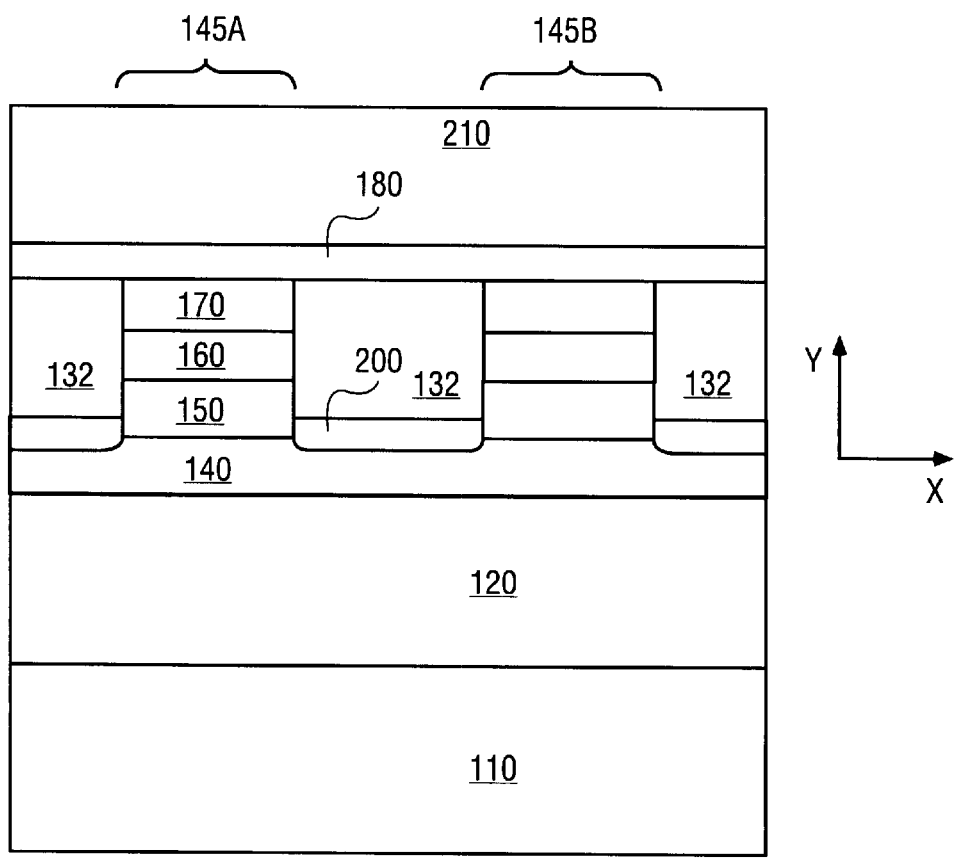
FIG. 7 depicts the structure of FIG. 6, through the same cross-sectional view, after forming a masking material and a dielectric material.

FIG. 7 depicts the structure of FIG. 6 after the introduction of masking material 180. As will become more clear later, masking material 180 serves, in one sense, as an etch stop for a subsequent etch operation. In one embodiment, a suitable material for masking material 180 is a dielectric material such as silicon nitride (Si$_3$N$_4$).

FIG. 7 also depicts dielectric material 210 introduced over the structure to a thickness on the order of 100Å to 50,000Å sufficient to blanket memory cells 145A and 145B. In one embodiment, dielectric material 210 is SiO$_2$. In another embodiment, dielectric material 210 is a material selected for its reduced thermal conductivity, κ, preferably a thermal conductivity less than κSiO$_2$, more preferably three to 10 times less κSiO$_2$. As a general convention, SiO$_2$ and Si$_3$N$_4$ have κ values on the order of 1.0. Thus, in addition to SiO$_2$, suitable materials for dielectric material 210 include those materials that have κ values less than 1.0. Certain high temperature polymers having κ values less than 1.0, include carbide materials, Aerogel, Xerogel (κ on the order of 0.1) and their derivatives.

Figure 8:
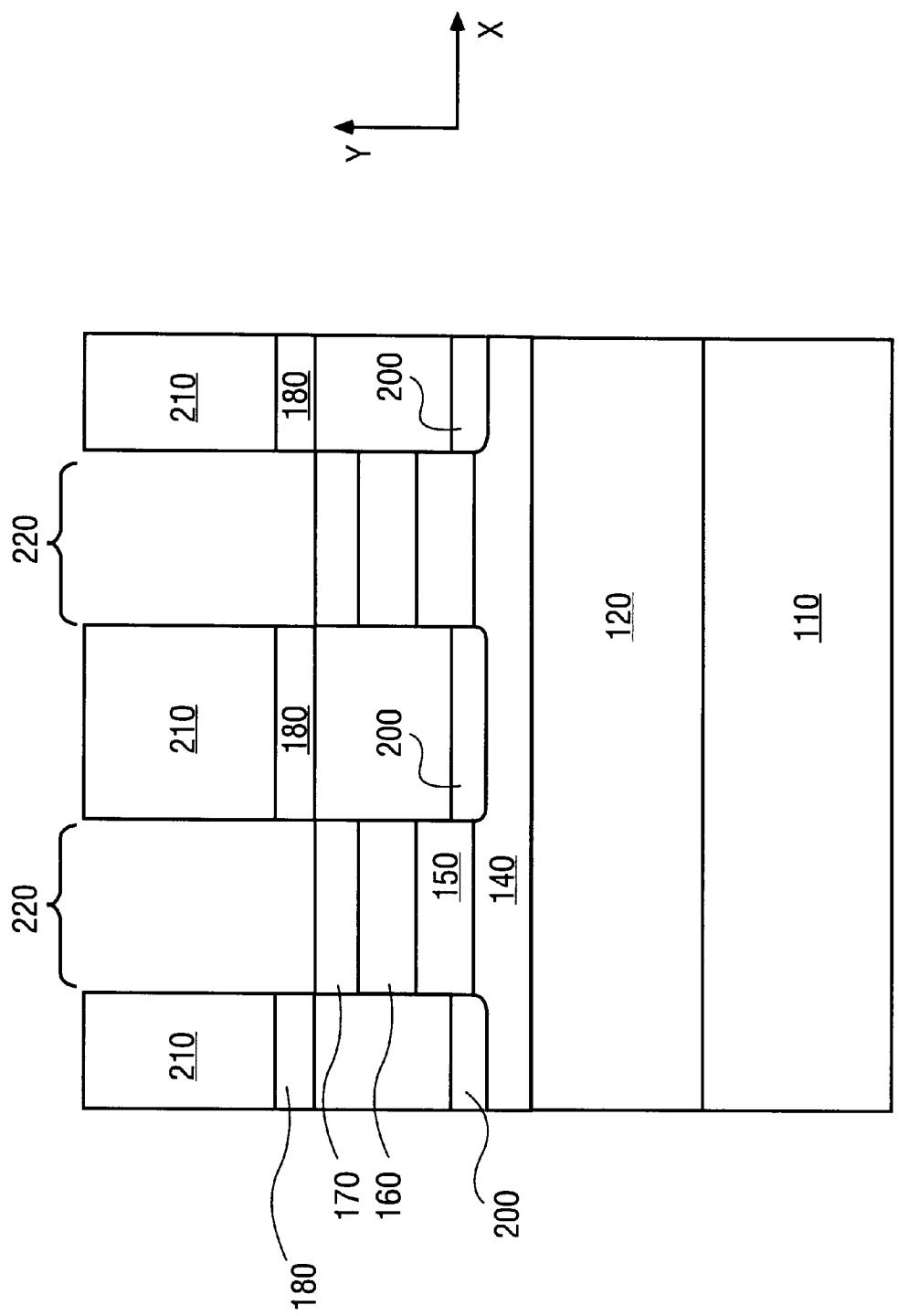
FIG. 8 depicts another cross-section view of the structure of FIG. 7, after forming an opening through the dielectric exposing the contact.

FIG. 8 depicts the structure of FIG. 7, through the same cross-sectional view, after forming openings 220 through dielectric 210 and masking material 180, exposing contact 170. In one embodiment, openings 220 are formed by patterning of circular holes etched through dielectric 210 and masking material 180, using conventional photolithography and dry etching techniques. In terms of state of the art photolithography techniques, circular openings as small as 0.25 μm in diameter can be patterned. It is to be appreciated that, in addition to circular openings, other openings such as rectangular openings could alternatively be employed.

Figure 9:
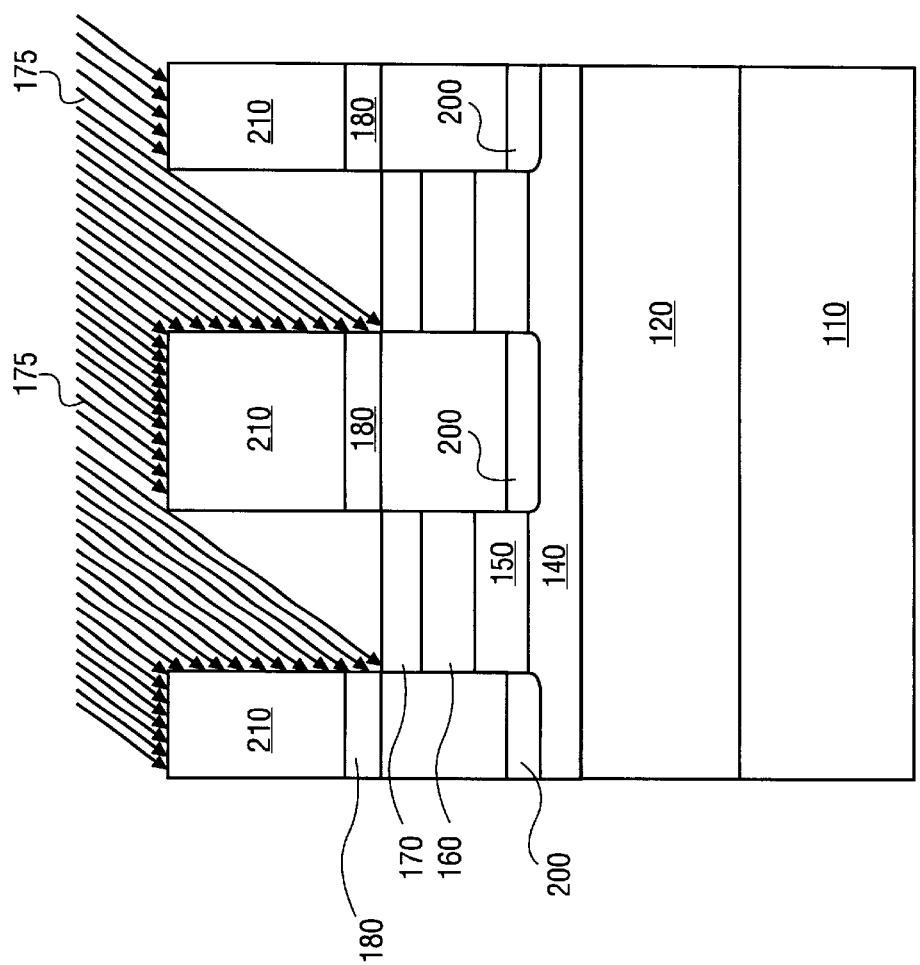
FIG. 9 depicts the structure of FIG. 8, through the same cross-sectional view, illustrating an angled modification of the contact.
Figure 9:
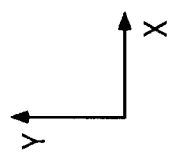

FIG. 9 depicts the structure of FIG. 8, through the same cross-sectional view, illustrating an angled modification of contact 170. It is to be appreciated that the modification of contact 170 can also be accomplished in a non-angled manner. By "angled" it is meant that, for example, the direction of ion implantation is not parallel to the illustrated y-axis depicted in FIG. 9. Further, while the modification depicted by FIG. 9 illustrates ion implantation, other methods of modification can be employed including, but not limited to, depositing material onto contact 170 and treating contact 170 with plasma, thereby increasing the resistivity of contact 170.

In an embodiment, contact 170 is modified by implanting ions 175 into contact 170. Ion implantation provides positional control precision and avoids side diffusion issues. Impact damage to contact 170 from ion implantation results in partial or complete amorphization, increasing the resistivity of contact 170 and increasing the ability of contact 170 to form chemical compounds with atoms introduced by ion implantation or other methods. Ions that are capable of forming compounds with CoSi$_2$ and thereby increase the resistivity of contact 170 can be utilized, including oxygen ions, nitrogen ions and carbon ions. For example, in the case that contact 170 is composed of CoSi$_2$, implanting oxygen ions within the CoSi$_2$ causes the formation of insulator regions of SiO$_2$ within contact 170, thereby increasing the resistivity of contact 170. Alternatively, when nitrogen ions are implanted into contact 170 (composed of CoSi$_2$), insulator regions of Si$_3$N$_4$ are formed within contact 170. Ion implantation provides precision in that the number of ions specified can be correspondingly implanted. Further, the depth of ion implantation can be selected using conventionally known published tables and considering factors including ion mass, ion energy, and composition and thickness of contact 170.

In an embodiment, as shown in FIG. 9, dielectric 210 serves as an ion implantation mask allowing ions to be implanted in contact 170 or in a portion of contact 170. Most films employed in the semiconductor process can be used to block an ion beam, including SiO$_2$, silicon nitride, aluminum, and other thin metal films.

In an embodiment, contact 170 is modified by depositing a resistive material on contact 170. In an embodiment, the resistive material has a resistivity of one of 0.001 ohm-cm to 0.5 ohm-cm. The resistivity is selected by specifying a resistive material film thickness, specifying a target programming current, specifying a voltage budget for the memory device and utilizing conventional calculations. In an embodiment, contact 170 has a series resistance of one of 200 ohms to 2000 ohms. In an embodiment, the resistive material is formed on contact 170 or on a portion of contact 170. Although resistive material is also formed on the walls of openings 220, significant current is not shunted away from programmable material 404, given a sufficiently high resistivity of the resistive material.

In an embodiment, contact 170 is modified by plasma treatment by exposing contact 170 within openings 220 to at least one of activated nitrogen, activated oxygen and ammonia. The plasma chemically reacts with, and increases the resistivity of, contact 170. Moreover, the resistivity of contact 170 can be modified using one of any, a combination of any, and all of the above referenced methods.

Figure 10:
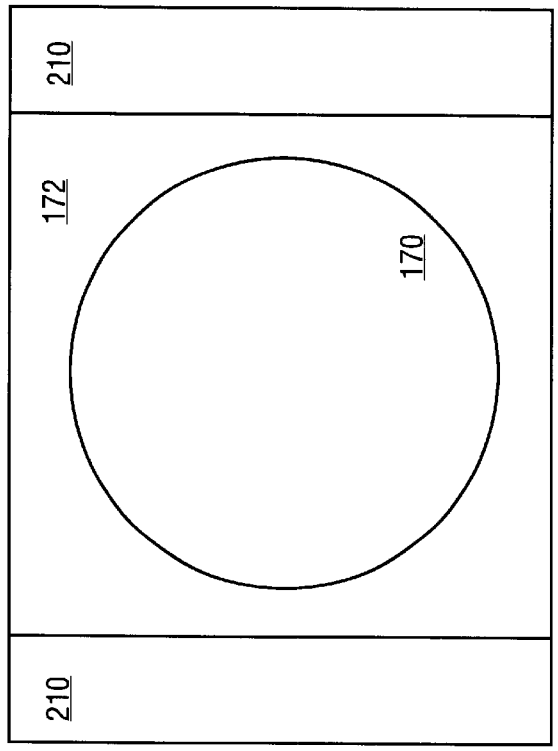
FIG. 10 depicts another cross-sectional view of the structure of FIG. 9 illustrating an area of modification to the contact.
Figure 10:
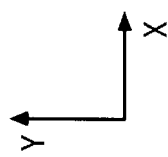

FIG. 10 depicts another cross-sectional view of the structure of FIG. 9 illustrating an area of modification to contact 170 by implanting ions 175 at an angle to the y-axis. The area of contact 170 that is modified is depicted as modified area 172 shown on the perimeter of contact 170, within opening 220. In an embodiment, modified area 172 is higher in resistivity than the remainder of contact 170. In an embodiment, programmable material 404 that undergoes a phase change is positioned on contact 170, but not on modified area 172. Less programmable material that undergoes a phase change is therefore utilized, resulting in less power consumption and improved programming reliability. In another embodiment, in which a non-angled modification of contact 170 is employed, modified area 172 includes the entire exposed surface area of contact 170 within openings 220, and programmable material 404 that undergoes a phase change is formed on all of modified area 172. By increasing the resistivity of contact 170, the power dissipation and heat transferred from contact 170 to programmable material 404 is increased which can reduce programming current requirements and improve programming reliability. Further, by increasing the resistivity of contact 170, the chemical reactivity of contact 170 with programmable material 404 can be decreased and adherence of programmable material 404 to the contact 170 can be increased.

Figure 11:
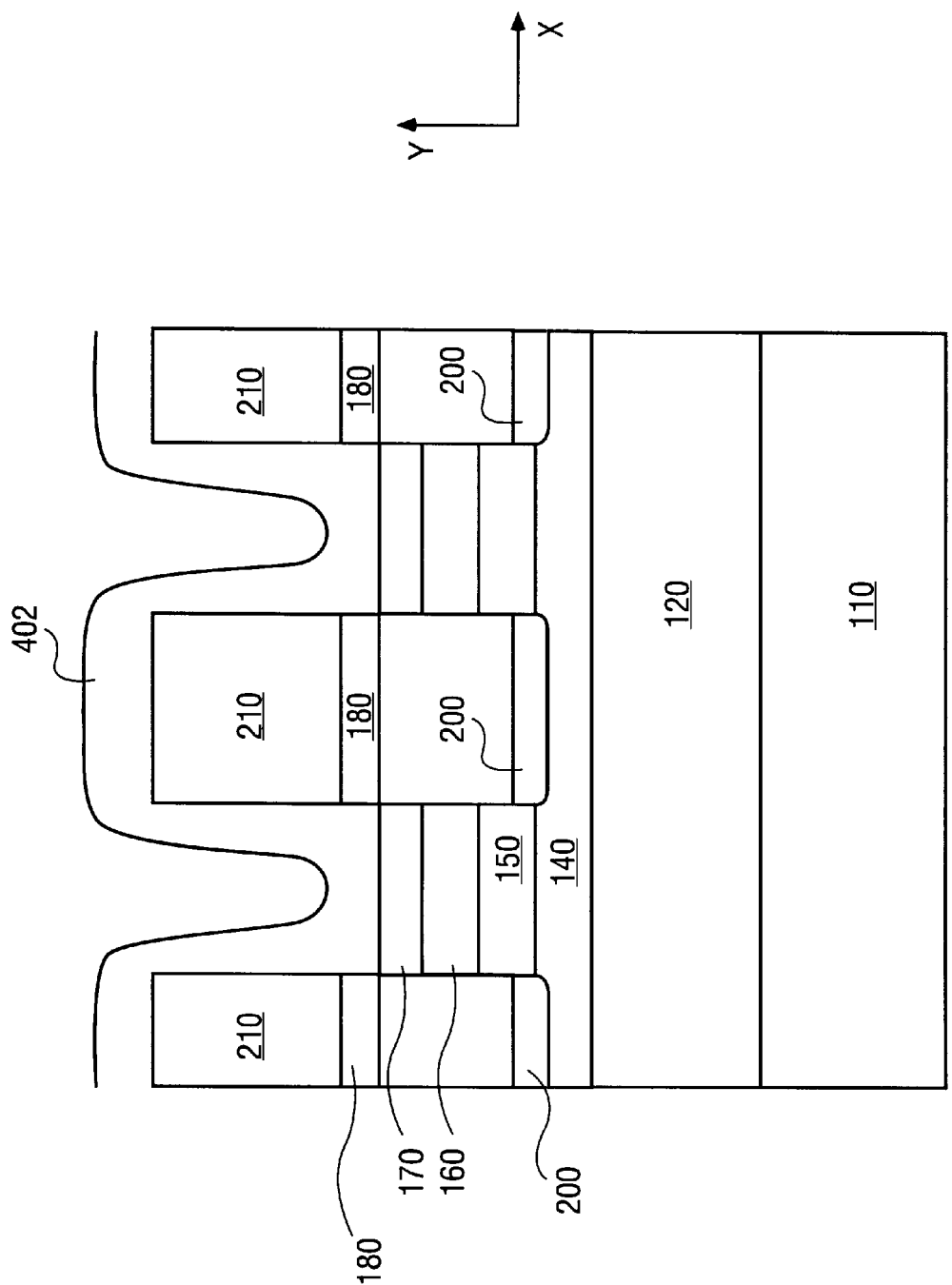
FIG. 11 depicts the structure of FIG. 8, through the same cross-sectional view, after conformally forming a spacer within the opening.

FIG. 11 depicts the structure of FIG. 8, through the same cross-sectional view, after forming spacer material 402 within openings 220 and on dielectric 210. In one embodiment, spacer material 402 is conformally formed, for example by chemical vapor deposition of tetra-ethyl-orthosilicate (TEOS) on the substrate. At this point of fabrication, spacer material covers contact 170 within openings 220.

Figure 12:
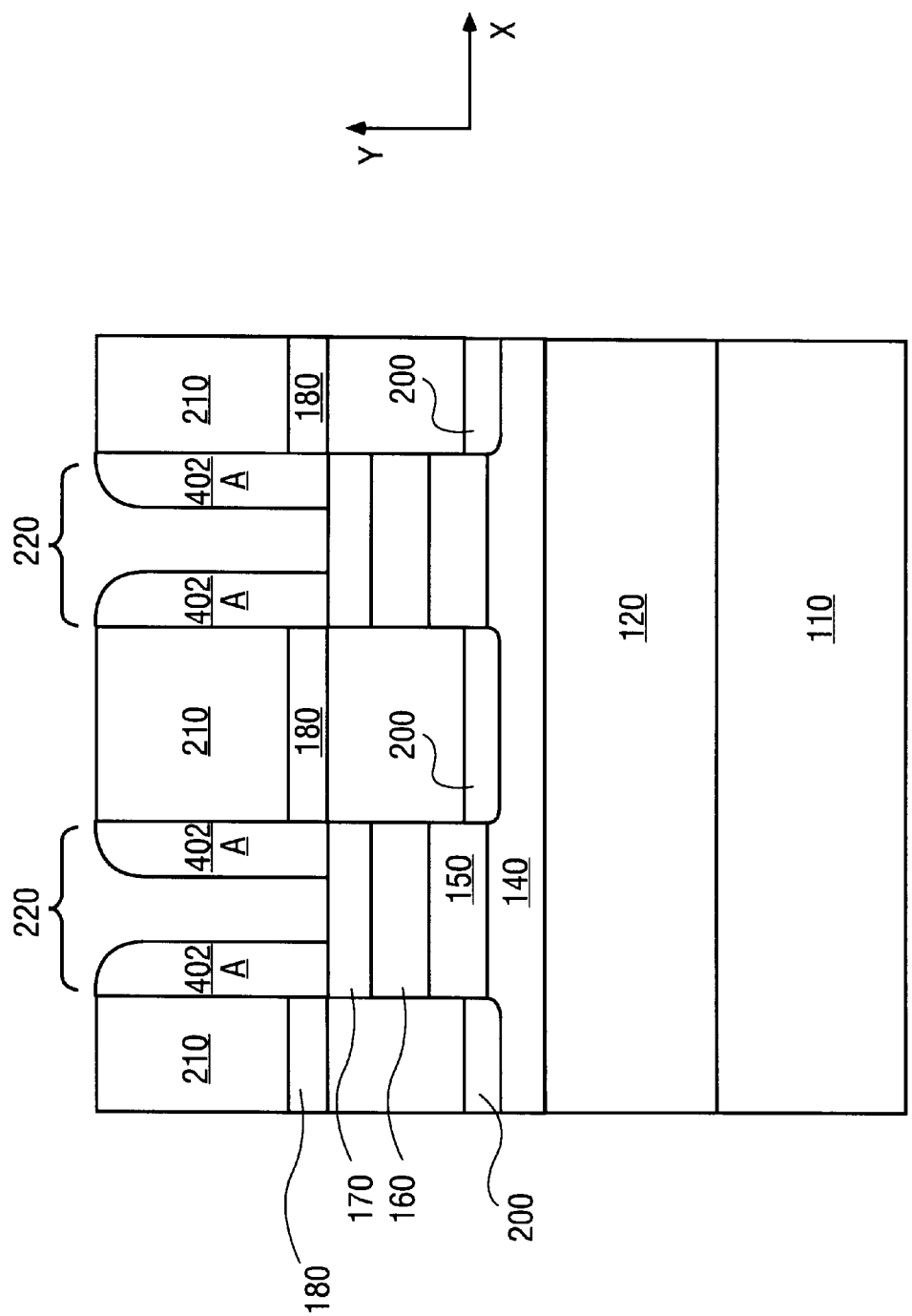
FIG. 12 depicts the structure of FIG. 9, through the same cross-sectional view, after etching the spacer.

FIG. 12 depicts the structure of FIG. 11 after spacer material 402 is etched to form dielectric spacers (spacer material portions 402A) inside openings 220. In one embodiment, spacer material 402 is anisotropically etched using a timed etch. In one aspect, that will become more clear later, spacer material 402 serves to reduce the quantity of programmable material 404 (FIG. 16) on contact 170.

Figure 13:
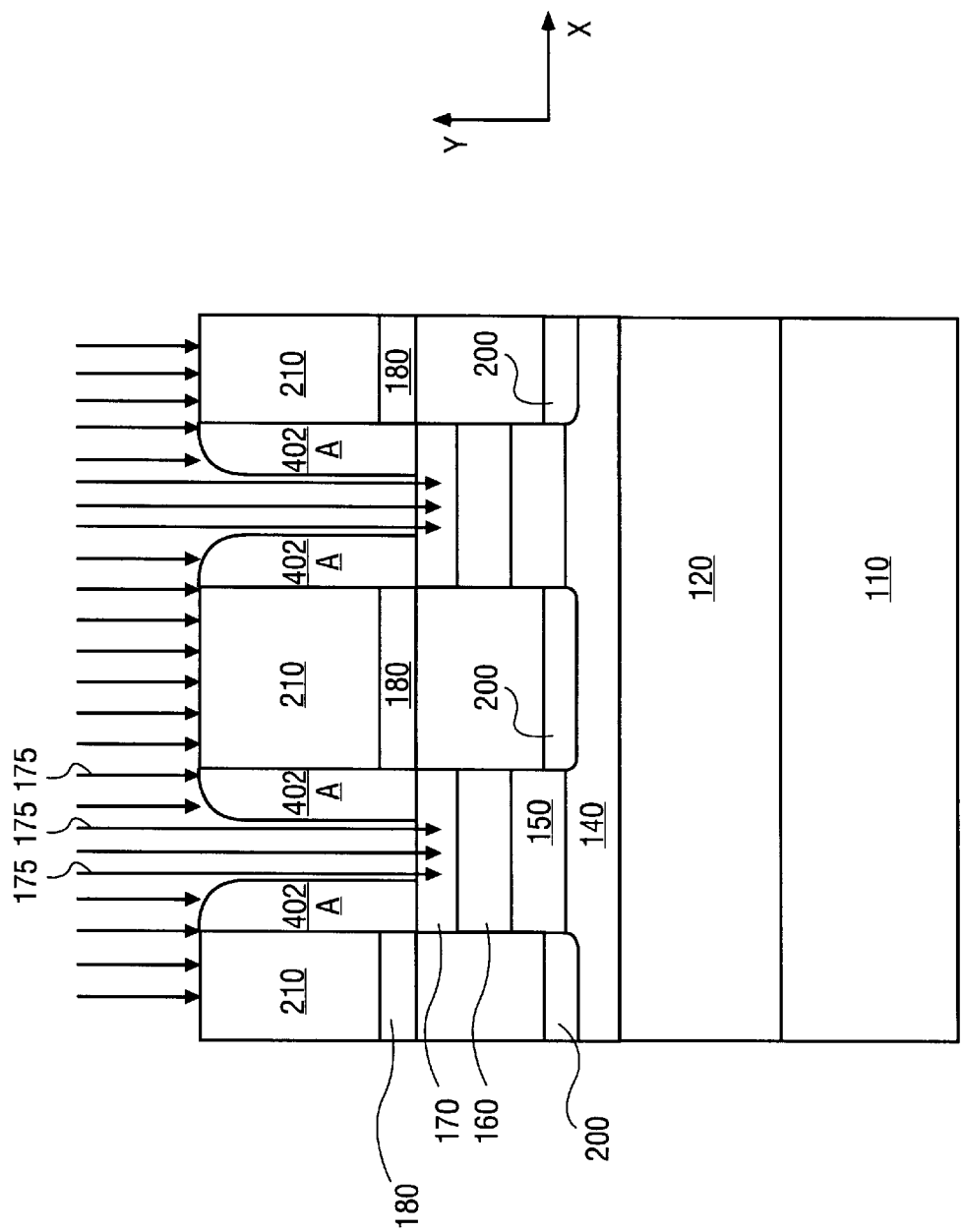
FIG. 13 depicts the structure of FIG. 12, through the same cross-sectional view, illustrating a self-aligned modification of the contact.

FIG. 13 depicts the structure of FIG. 12, through the same cross-sectional view, illustrating a self-aligned modification of contact 170. The modification is self-aligned by spacers 402A that act as an ion implantation mask. It is to be appreciated that modification of contact 170 can be performed either before or after (or both before and after) spacers 402A are formed. Further, while FIG. 13 shows modification of contact 170 by implanting ions 175, additional methods of modification are available including depositing a material on contact 170 and exposing contact 170 to plasma.

Figure 14:
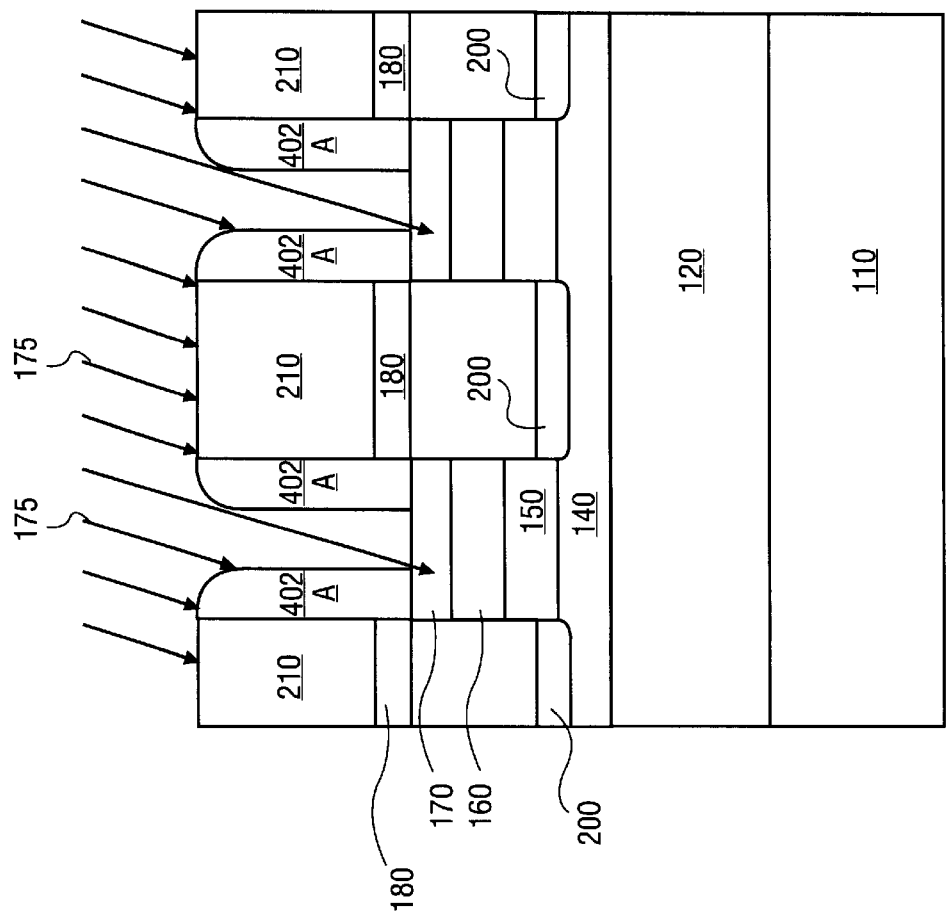
FIG. 14 depicts the structure of FIG. 12, through the same cross-sectional view, illustrating an angled modification of the contact.
Figure 14:
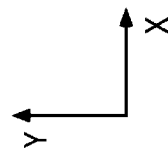

Alternatively, in an embodiment, ions are implanted at an angle to the walls of openings 220. FIG. 14 depicts the structure of FIG. 12, through the same cross-sectional view, illustrating an angled modification of contact 170 by implanting ions 175. Again, it is to be appreciated that additional methods of modification are available including depositing a material on contact 170 and exposing contact 170 to plasma.

Figure 15:
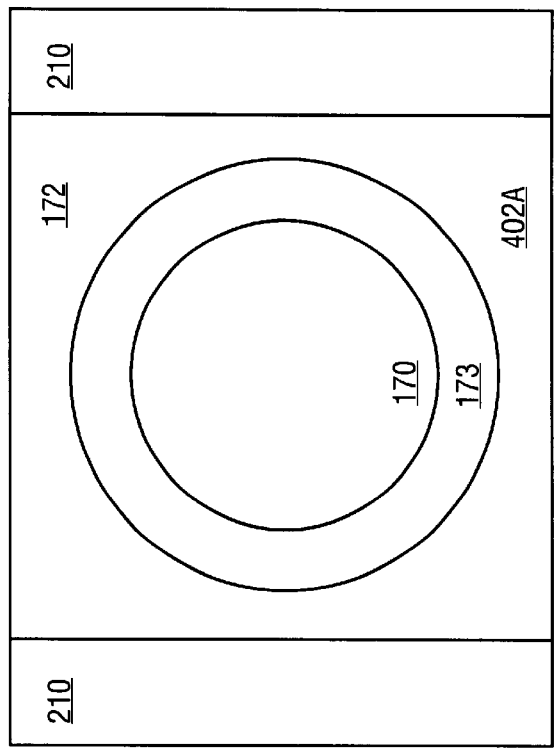
FIG. 15 depicts another cross-sectional view of the structure of FIG. 14 illustrating an area of modification to the contact.
Figure 15:
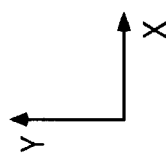

FIG. 15 depicts another cross-sectional view of the structure of FIG. 14 illustrating an area of modification to contact 170, namely modified area 173. In an embodiment, programmable material 404 that undergoes a phase change is positioned on contact 170, but not on modified area 172. Less programmable material that undergoes a phase change is therefore utilized, resulting in less power consumption and improved programming reliability.

Figure 16:
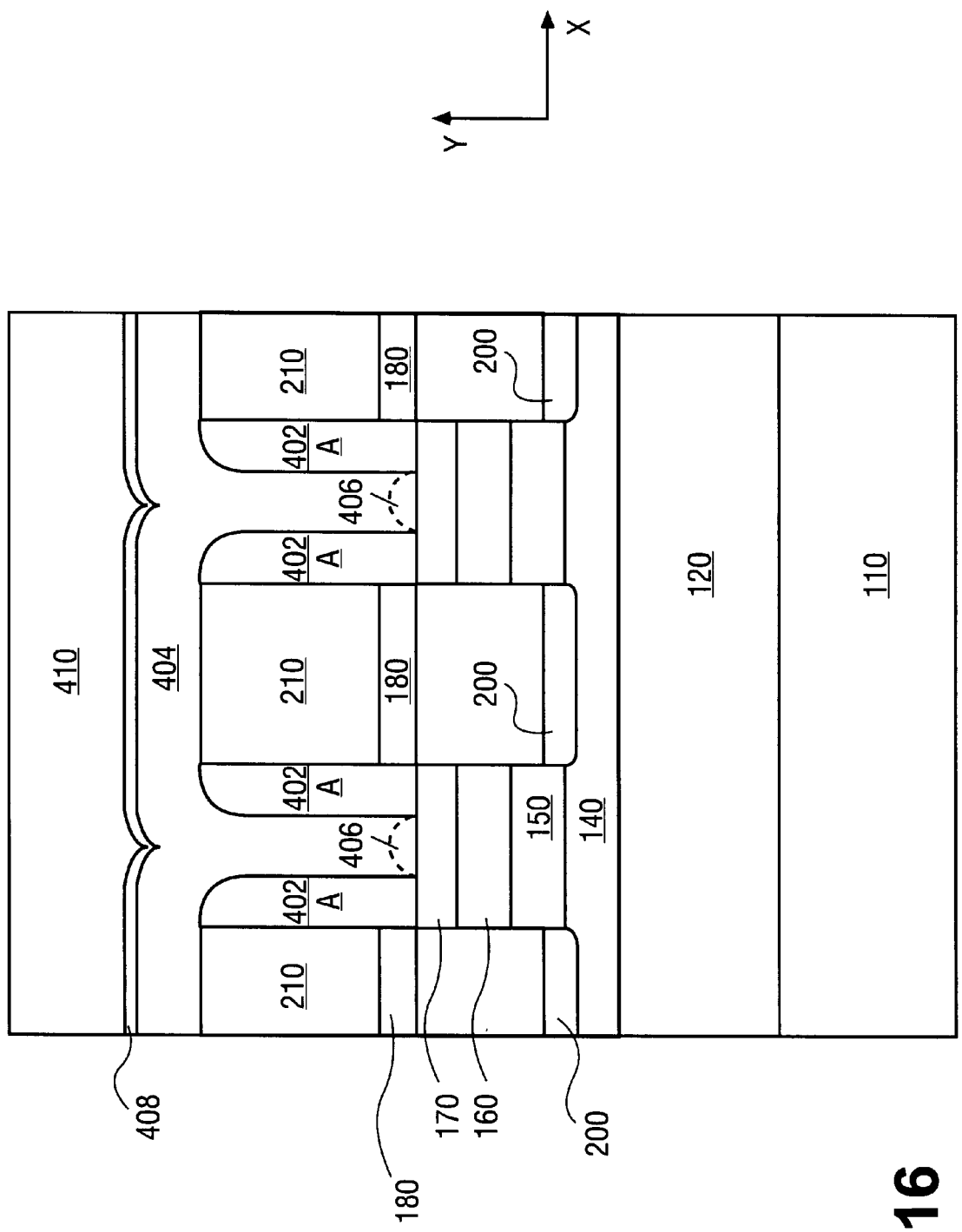
FIG. 16 depicts the same cross-sectional view of the structure of FIG. 12, after forming programmable material, a barrier and a conductor.

FIG. 16 depicts the structure of FIG. 13 after introducing programmable material 404 within openings 220, on contact 170 and on dielectric 210. In one embodiment, programmable material 404, a phase change material that has a property such that a physical state (e.g., crystalline, amorphous) can be modified with the application of an amount of energy (e.g., electrical energy, thermal energy). Chalcogenide materials having the general formula are known to be suitable for this purpose such that chalcogenide materials can be introduced on the substrate and on contact 170 by conventional deposition techniques.

As further illustrated in FIG. 16, following the introduction of programmable material 404, barrier material 408 is formed on programmable material 404 and conductor 410 is formed on barrier material 408, in accordance with an embodiment. Barrier material 408 serves, in an aspect, to prevent any chemical reaction between programmable material 404 and conductor 410. In an embodiment, programmable material 404, spacer 402, barrier material 408 and conductor 410 are formed using conventional patterning techniques. In an embodiment, barrier material 408 includes at least one of titanium and titanium nitride. Titanium and/or Titanium nitride coatings can be deposited uniformity on a substrate, showing good adhesion in that they resist flaking, blistering, chipping and peeling. In an embodiment, programmable material 404 includes a phase change material of a chalcogenide alloy and contact 170 includes $CoSi_2$. In an embodiment, chalcogenide alloys suitable as programmable material 404 include at least one element from column VI of the Periodic Table Of The Elements. In an embodiment, $Ge_2Sb_2Te_5$ is utilized as programmable material 404. Other chalcogenide alloys utilized as programmable material 404 include GaSb, InSb, InSe, $Sb_2Te_3$, GeTe, $Ge_2Sb_2Te_5$, InSbTe, GaSeTe, $SnSb_2Te_4$, InSbGe, AgInSbTe, (GeSn)SbTe, GeSb(SeTe), and $Te_{81}Ge1_5Sb_2S_2$.

In the structure illustrated in FIG. 16, the contact area of programmable material 404 and contact 170 is minimized by the presence of spacer material portions 402A. In an aspect, the dimensions of openings 220 expose a first contact area of contact 170. In an aspect, a second contact area, less than the first contact area, is exposed by spacer material 402 and/or spacer material portions 402A. By minimizing the quantity of programmable material 404, the quantity of programmable material 404 that undergoes, for example, a phase change from/to amorphous and crystalline on contact 170 (as shown by region 406) is localized. Region 406, shown between spacer material portions 402A, defines a limited and localized programming region of programmable material 404, adding to the programmable reliability from and to an amorphous and crystalline state of programmable material 404. In general, by localizing the phase change area, less current is required through programmable material 404 during programming and reading, and less power consumption results.

Figure 17:
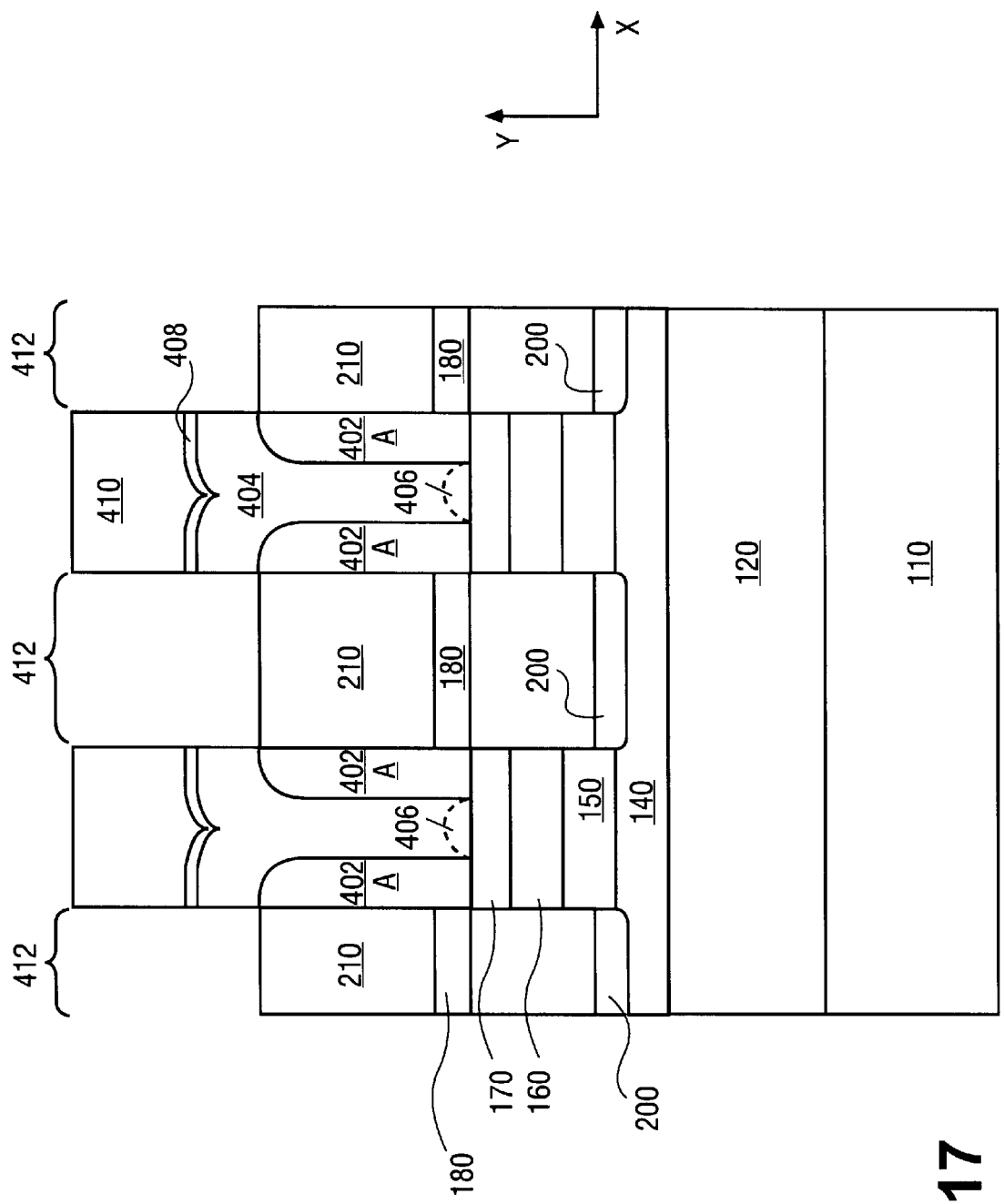
FIG. 17 depicts the same cross-sectional view of the structure of FIG. 16, after patterning the programmable material, barrier and conductor.
Figure 18:
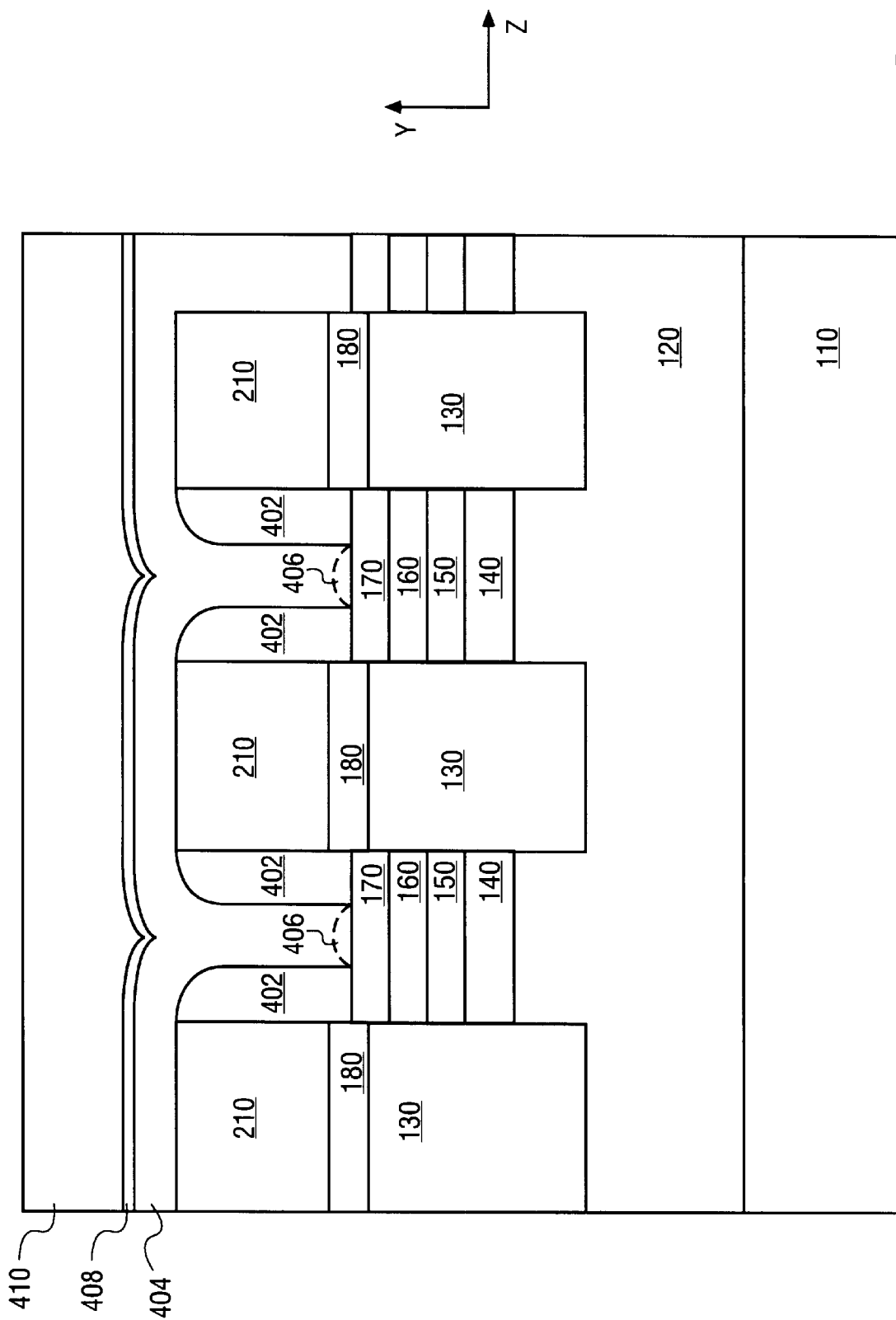
FIG. 18 depicts another cross-sectional view of the structure of FIG. 17.

FIG. 17 depicts the structure of FIG. 16, from an xy perspective, after forming openings 412. Openings 412 serve, in one aspect, to define the x-direction thickness of programmable material 404, barrier material 408 and conductor 410. Openings 412 serve, in another aspect, to isolate individual memory elements from one another as well as associated circuit elements (e.g., transistor devices) formed on the substrate. In one embodiment, openings 412 are formed by patterning of openings through conductor 410, barrier material 408 and programmable material 404. The patterning can be accomplished using conventional photolithographic and etch techniques. In this example, the etching proceeds through conductor 410, barrier material 408 and programmable material 404, to the exclusion of dielectric 210. According to current photolithographic techniques, a suitable feature size for the x-direction thickness of openings 412 include as small as 0.25 µm. FIG. 18 depicts another cross-sectional view, from the yz perspective, of the structure of FIG. 17.

Figure 19:
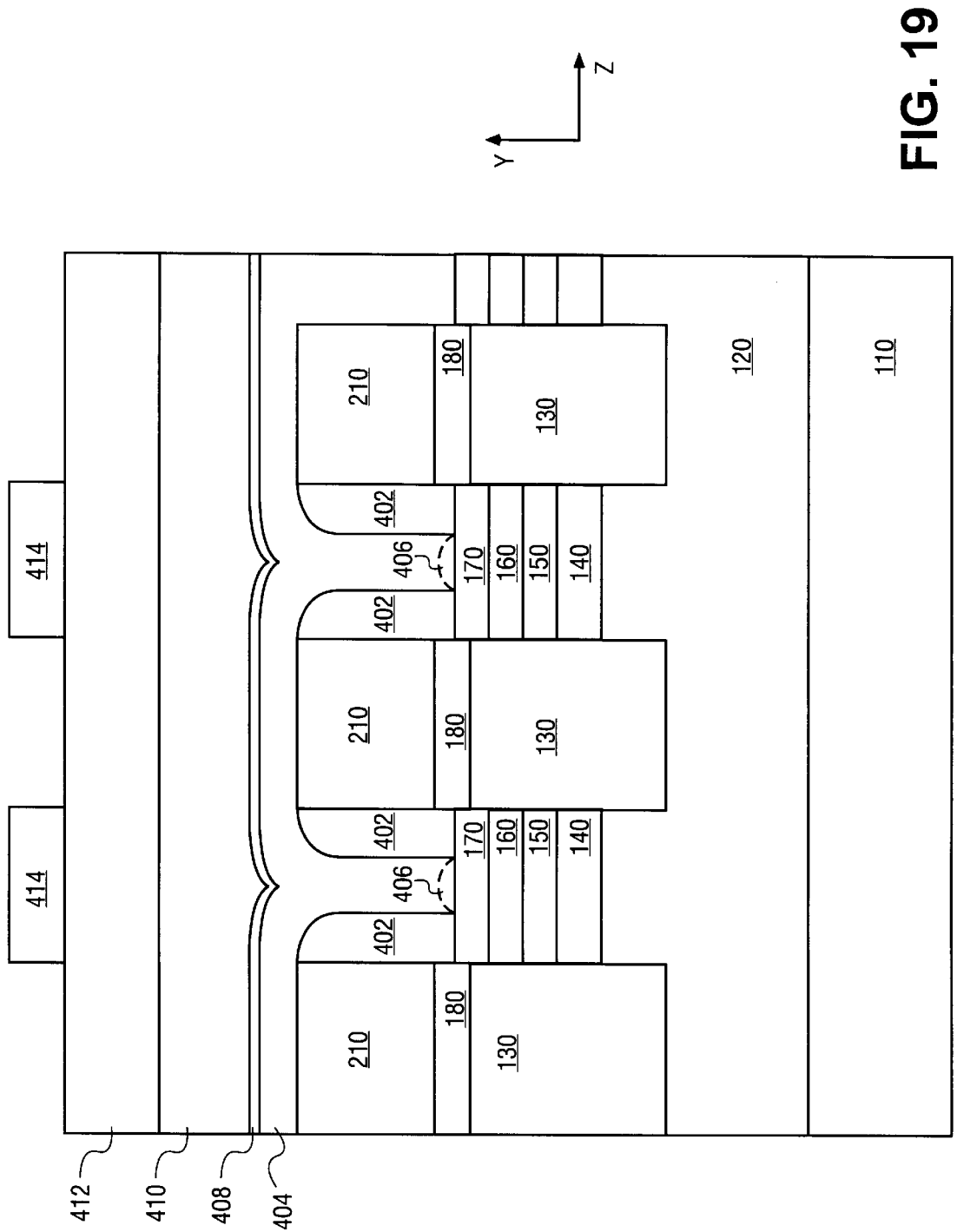
FIG. 19 depicts the same cross-sectional view of the structure of FIG. 18, after forming a dielectric material and a signal line.

FIG. 19 shows the structure of FIG. 18 after forming dielectric material 412 on conductor 410. Dielectric material 412 is, for example, $SiO_2$ or other suitable material that is formed on conductor 410 to electronically isolate conductor 410. Following the formation, dielectric material 412 is planarized and a via is formed in a portion of the structure through dielectric material 412, dielectric material 210, and dielectric material 180 to contact 170. The via is filled with conductive material such as tungsten (W) and a barrier material such as a combination of titanium (Ti) and titanium nitride (TiN). Techniques for introducing dielectric material 412, forming and filling conductive vias, and planarizing are known to those skilled in the art. The structure shown in FIG. 19 also shows additional conductor or signal line material 414 formed and patterned to mirror that of conductor or signal line material 140 (e.g., row line) formed on substrate 100. Mirror conductor line material 414 mirrors conductor or signal line material 140 and is coupled to conductor or signal line material 140 through the conductive via. By mirroring a doped semiconductor such as N-type silicon, mirror conductor line material 414 serves, in one aspect, to reduce the resistance of conductor or signal line material 140 in a memory array, such as memory array 5 illustrated in FIG. 1. A suitable material for mirror conductor line material 414 includes an aluminum material, such as an aluminum alloy.

Figure 20:
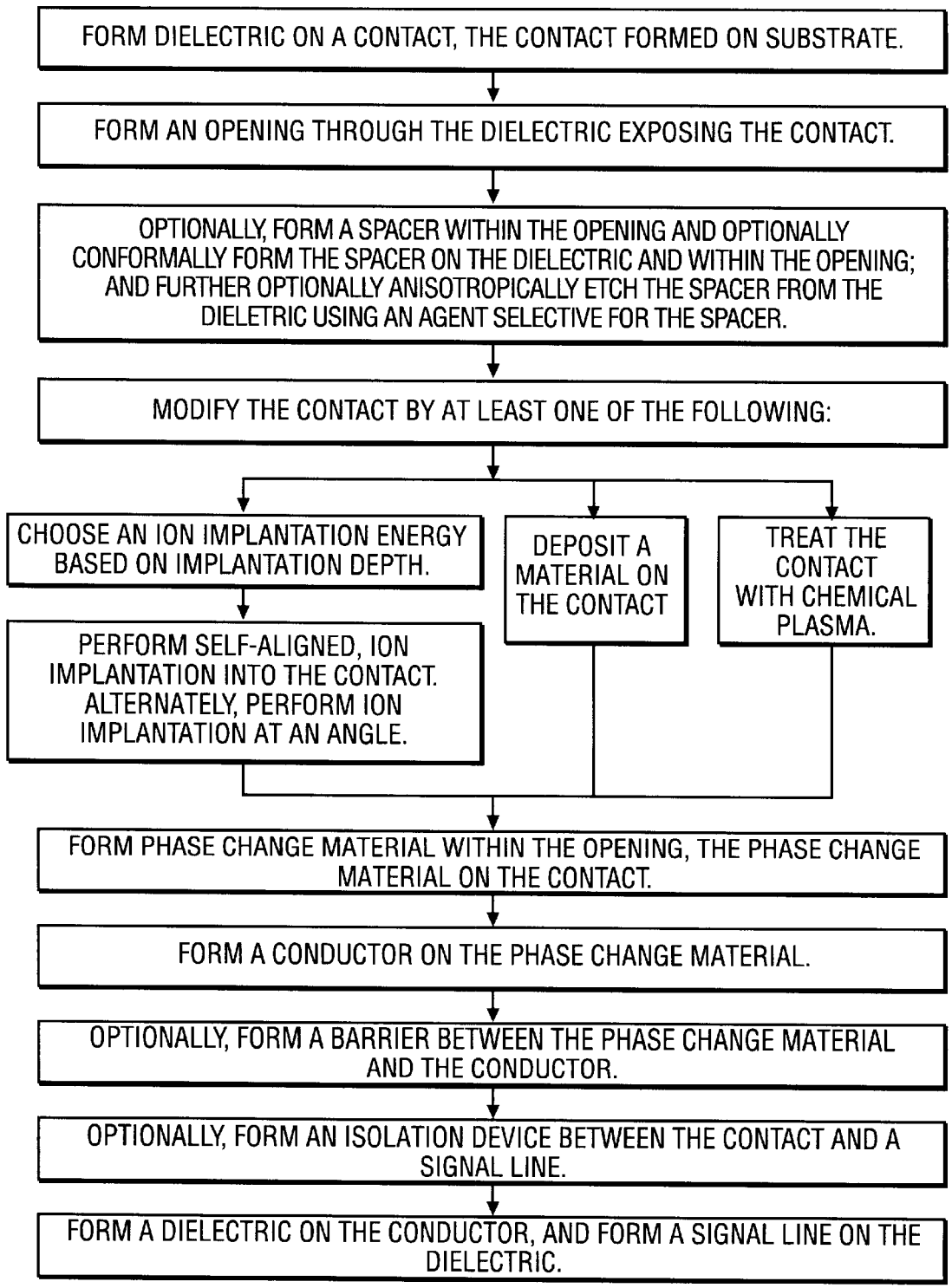
FIG. 20 depicts one method of forming a memory device.

FIG. 20 describes a method in forming a programmable memory device in accordance with an embodiment.

Figure 21:
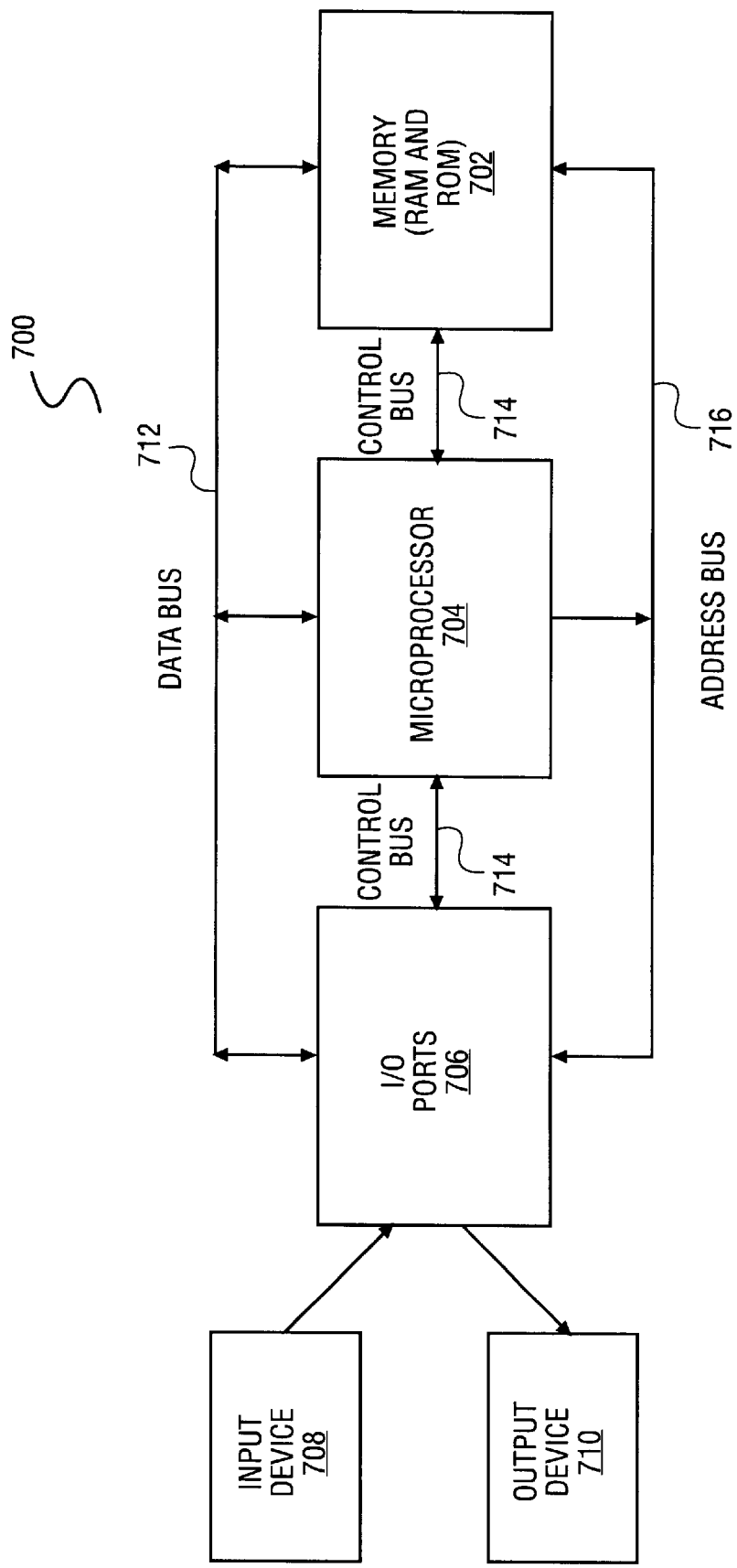
FIG. 21 depicts one system embodiment including a memory having a structure similar to that described by FIG. 19.

Further, as depicted in FIG. 21, a memory array such as memory device 5 (FIG. 1) wherein the individual memory cells have a structure similar to that described with reference to FIG. 19 and the accompanying text can be incorporated into a suitable system. In one embodiment, system 700 includes microprocessor 704, input/output (I/O) port 706, and memory 702. Microprocessor 704, I/O port 706, and memory 702 are connected by data bus 712, address bus 716 and control bus 714. Microprocessor 704 fetches instructions or reads data from memory 702 by sending out an address on address bus 716 and a memory read signal on control bus 714. Memory 702 outputs the addressed instruction or data word to microprocessor 704 on data bus 712. Microprocessor 704 writes a data word to memory 702 by sending out an address on address bus 716, sending out the data word on data bus 712, and sending a memory write signal to memory 702 on control bus 714. I/O port 706 is utilized to couple to at least one of input device 708 and output device 710.

Having disclosed exemplary embodiments, modifications and variations may be made to the disclosed embodiments while remaining within the spirit and scope of the invention as defined by the appended claims.

What is claimed is:

1. A method comprising:

forming a dielectric on a contact, the contact formed on a substrate;

forming an opening through the dielectric exposing the contact;

forming a spacer within the opening;

modifying the resistivity of the contact after forming the spacer;

forming a programmable material within the opening, the programmable material on the contact; and forming a conductor to the programmable material.

2. The method of claim 1, wherein forming programmable material within the opening comprises forming a chalcogenide memory element within the opening.

3. The method of claim 1, wherein modifying the resistivity of the contact comprises at least one of implanting ions into the contact, depositing material on the contact, and treating the contact with plasma.

4. The method of claim 3, wherein implanting ions comprises one of implanting ions at normal incidence to a surface of the contact exposed to the opening, and implanting ions at an angle to the surface of the contact exposed to the opening.

5. The method of claim 3, wherein implanting ions comprises embedding the contact with ions at a predetermined depth utilizing at least one of oxygen ions, nitrogen ions and carbon ions.

6. The method of claim 3, wherein depositing material on the contact comprises depositing a predetermined amount of material causing the contact to have one of 200 ohms to 2000 ohms of series resistance, based on a predetermined current through the contact.

* * * * *